(12) United States Patent
Swami

(10) Patent No.: US 7,078,932 B2
(45) Date of Patent: Jul. 18, 2006

(54) PROGRAMMABLE LOGIC DEVICE WITH REDUCED POWER CONSUMPTION

(75) Inventor: Parvesh Swami, New Delhi (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 20 days.

(21) Appl. No.: 10/830,854

(22) Filed: Apr. 23, 2004

(65) Prior Publication Data

US 2005/0035782 A1    Feb. 17, 2005

(30) Foreign Application Priority Data

Apr. 25, 2003    (IN) .................................. 634/03

(51) Int. Cl.
*H03K 19/173*    (2006.01)

(52) U.S. Cl. ............................... 326/38; 326/39

(58) Field of Classification Search ............. 326/37–41
See application file for complete search history.

(56) References Cited

U.S. PATENT DOCUMENTS

| 5,132,555 | A | * | 7/1992 | Takahashi ................... 326/102 |
| 5,821,771 | A | * | 10/1998 | Patel et al. ................... 326/38 |
| 6,101,143 | A | | 8/2000 | Ghia |
| 6,102,963 | A | * | 8/2000 | Agrawal ....................... 716/17 |
| 6,384,628 | B1 | * | 5/2002 | Lacey et al. .................. 326/41 |
| 6,710,621 | B1 | * | 3/2004 | Devlin et al. ................. 326/38 |
| 6,914,449 | B1 | | 7/2005 | Kaviani |
| 2005/0091629 | A1 | * | 4/2005 | Eisenstadt et al. ............ 716/13 |

OTHER PUBLICATIONS

Xilinx, XC4000E and XC4000X Series Field Programmable Gate Arrays, May 14, 1999, Version 1.6, pp. 6-5 thru 6-72.

* cited by examiner

*Primary Examiner*—Vibol Tan

(57) ABSTRACT

The present invention provides a programmable logic device with reduced power consumption comprising, a first set of data storage elements, at least a first power supply connected to the said first set of data storage elements, a second set of substantially identical interconnected tiles, each including logic blocks, at least a second power supply independent of the said first power supply connected to said identical tiles wherein said second power supply is switched-off when the logic block is not being used.

20 Claims, 6 Drawing Sheets

PROGRAMMABLE LOGIC DEVICE WITH REDUCED POWER CONSUMPTION

TECHNICAL FIELD OF THE INVENTION

The invention relates to Field Programmable Gate Arrays, and more particularly to a programmable logic device with reduced power consumption.

BACKGROUND OF THE INVENTION

The power efficiency of any device architecture is directly affected by its design. As the complexity, speed and density of the device architecture increases, the power consumption also increases. In particular, for FPGAs, it is essential to use a large number of switches and buffers to improve the signal strength. Although the FPGAs use low power technologies e.g. CMOS technology, the power consumption issue becomes one of the limiting factors. To avoid this, it is highly requisite to save undesired power leakage from various parts of the circuit.

The explosion in the market demand for wireless, battery powered products of all kinds has created a tremendous emphasis on battery life which is largely determined by leakage power in standby mode—the mode in which a portable system spends the majority of the time.

The present design of FPGAs allows a current leakage from different parts. For example, when the FPGA is not being used and the outputs/inputs of logic blocks are stuck at one value, there is no dynamic power consumption, but due to leakage currents there is a static power consumption. The leakage current depends on the device channel length, temperature and power supply. Since channel length cannot be changed once the device is fabricated and chips are made to be used in different temperature zones, no standard method can be developed for reducing the power leakage by controlling temperature and device channel length.

It is feasible to reduce static power consumption effectively by regulating/redistributing power supply. Reducing supply voltage in CMOS devices will reduce the leakage current, but in case of FPGAs the supply voltage cannot be reduced considerably as it results in a loss of information stored in the memory cells. Further reduction in the supply voltage does not eliminate leakage current totally from the circuit since it is not possible with the present design to disconnect the supply from elements which are not in use in the circuit. Moreover, different users require FPGAs with different power specifications.

Further recent demands for portable appliances such as laptop computers, cell phones or PDAs also fuel the need for low power designs of FPGAs to achieve longer battery life and miniaturization. One way to avoid wasting any current is to turn off the FPGA when it is not being used, but it requires reconfiguration of the FPGA for the next operation. This increases the complexity and timing of the system and uses more power because the FPGA consumes a good amount of power during configuration. Therefore, a need has arisen for an FPGA, which allows the user to reduce the power consumption without disturbing the programming information when the FPGA is not in use.

SUMMARY OF THE INVENTION

To address the above-discussed deficiencies of the prior art, an object of the invention is to obviate above and other drawbacks related to the prior art.

Another object of the invention is to reduce the power consumption in the electrical circuits.

Yet another object of the invention to provide a low power electrical circuit without losing any information content in the circuit.

To achieve the above and other objects, the invention provides flexibility to shut off the power for logic circuits without disturbing the programming information during standby mode.

It is an objective of this invention to reduce the power consumption in an FPGA device. A dual power distribution facility can be used for programming storage and other circuitry present in the FPGA. Power distribution for the other circuitry may be shut down during a stand-by mode period. Therefore, the dual power distribution facility in the FPGA reduces the power consumption while maintaining the status of the system.

Accordingly, the instant invention provides a programmable logic device with reduced power consumption comprising:
  a first set of data storage elements;
  at least a first power supply connected to the said first set of data storage elements;
  a second set of substantially identical interconnected tiles, each including logic blocks;
  at least a second power supply independent of the said first power supply connected to said identical tiles wherein said second power supply is switched-off when the logic block is not being used.

The storage element are memory cells, configuration memory cells, registers, flip-flop, etc. or any combination of these.

The logic block includes logic elements.

The invention further provides a method for reducing the power consumption in programmable logic device comprising in steps of:
  providing a first set of data storage elements;
  connecting at least a first power supply to the said first set of data storage elements;
  providing a second set of substantially identical interconnected tiles, each including logic blocks;
  coupling at least a second power supply independent of the said first power supply to the identical tiles, and;

switching off the said second power supply when the tiles are not being used.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the terms "circuit" and "circuitry" may be used interchangeably and mean any device or part thereof that controls at least one operation, such a device may be implemented in hardware, firmware or software, or some combination of at least two of the same. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The invention will now be described with reference to and as illustrated in the accompanying drawings, in which like reference numerals represent like parts, and in which.

DETAILED DESCRIPTION OF THE INVENTION

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged image processing system.

Figure 1:
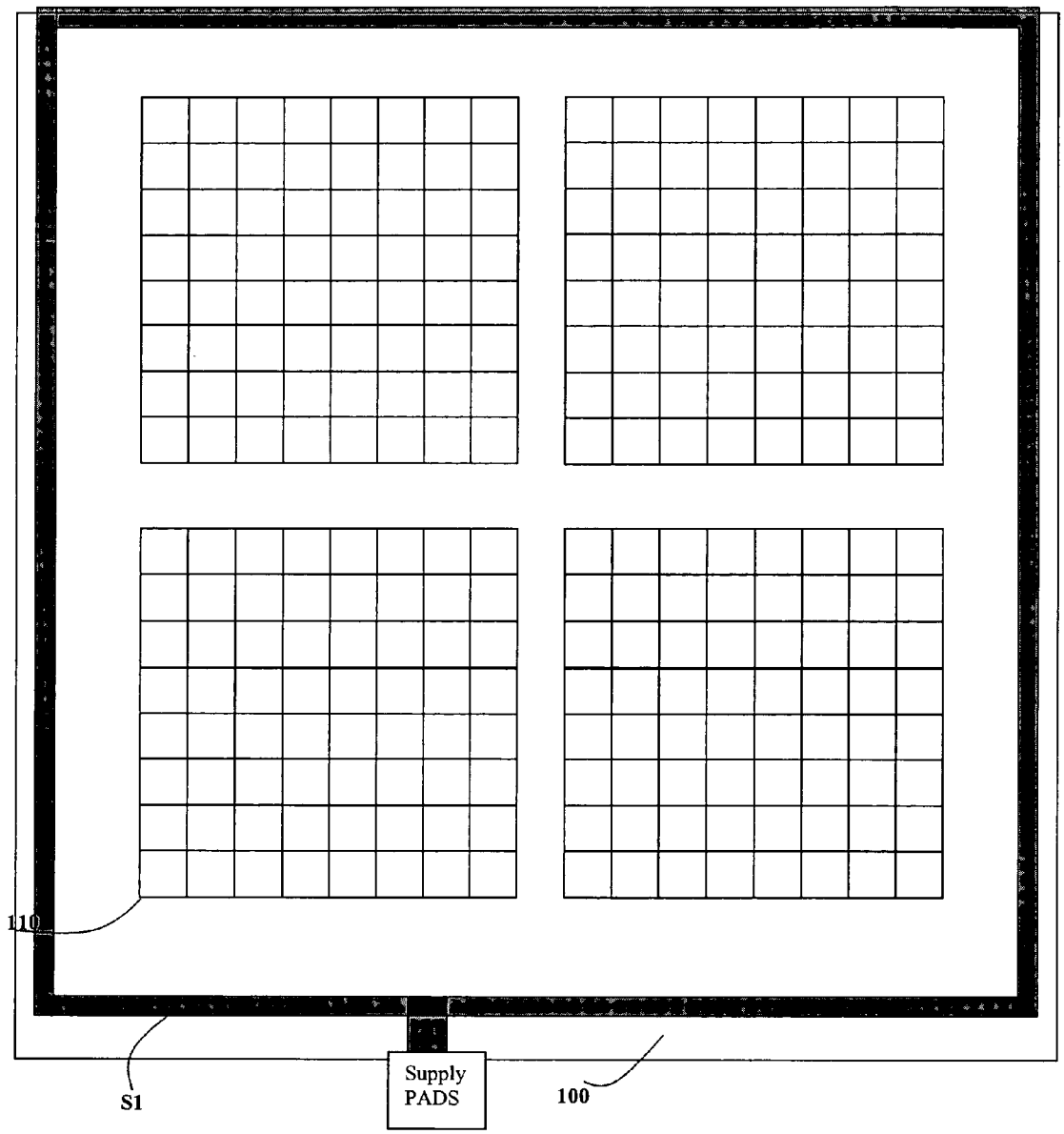
FIG. 1 shows a single supply network for FPGA according to conventional architecture.

Referring to FIG. 1, an FPGA 100 generally consists of an array of tiles 110 connected to each other by an interconnect architecture to provide the desired set of functions. The array of tiles comprises different CMOS circuitry like inverters/buffers, logical gates, decoders, multiplexers, flip-flops, DLLs/PLLs memories, etc. All these circuits include configuration cells. There are two type of static power, which is categorized by different types of current flow. The first type results from through currents that flow because of the use of current sources and are common in analog circuits such as differential amplifiers, PLLs/DLLs, and sense amplifies. The second type of static power is due to leakage that arises due to non-ideal switch behavior of transistors in the off state. Since the present FPGA architecture uses a single power supply S1, it is difficult overcome the leakage currents.

Figure 2:
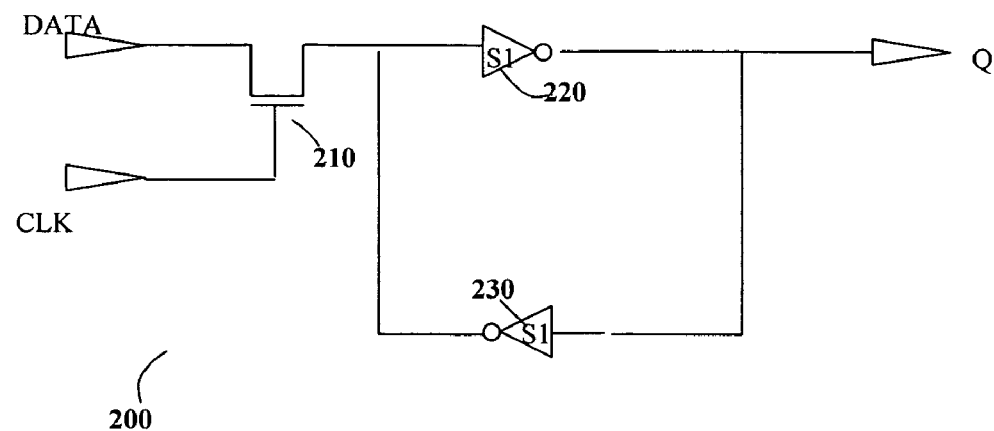
FIG. 2 shows a data storage cell used in FPGAs to store the information.

FIG. 2 shows a configuration cell 200, which is one of the basic elements for any FPGA. The configuration cell 200 comprises a cross coupled pair of CMOS inverters 220 and 230. NMOS transistor 210 is used to load the programming data in configuration cell 200 during configuration when configuration clock signal CLK is high. Inverters 220 and 230 are powered by power supply network S1.

Figure 3:
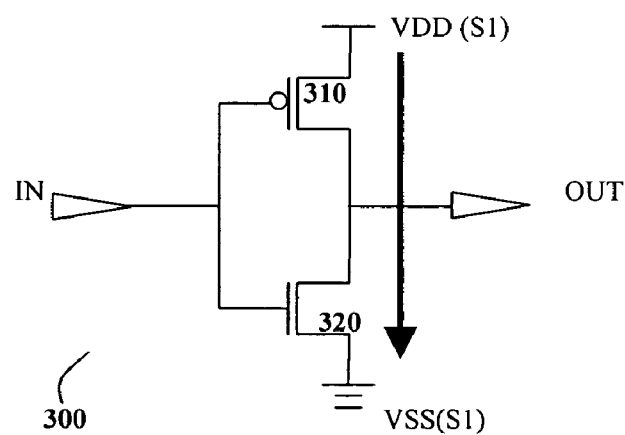
FIG. 3 shows an example of leakage current in an inverter.

FIG. 3 shows an example of leakage current in an inverter 300. In this inverter 300, the leakage current flows from high rail VDD (S1) through transistors 310 and 320 to ground. This condition can arise in both cases when the input is stuck at either a "0" state or a "1" state.

Figure 4:
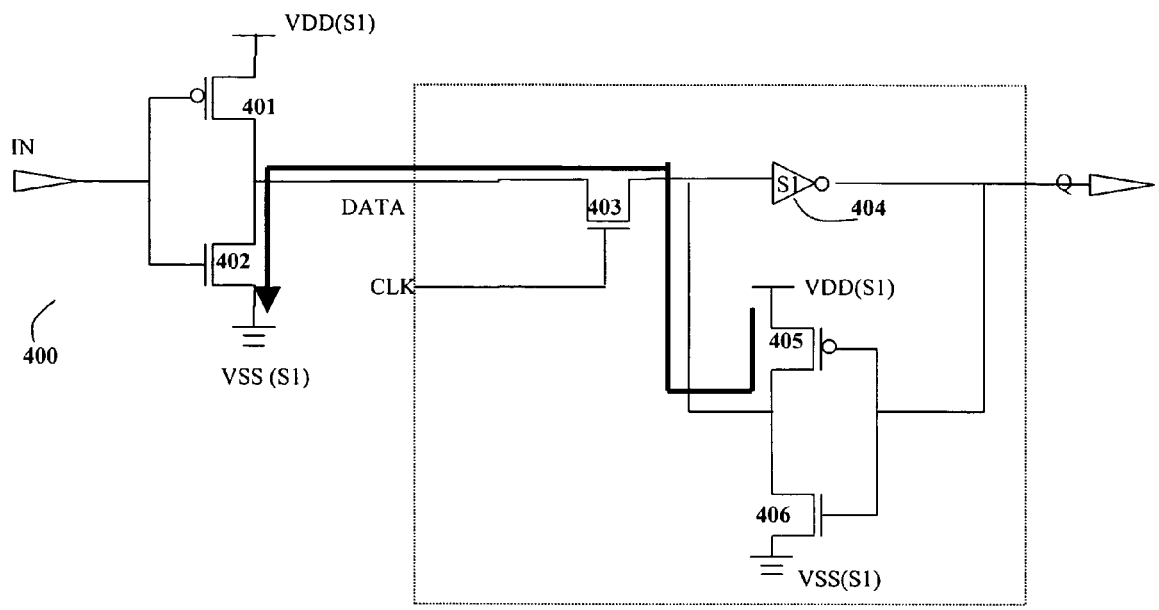
FIG. 4 shows an example of an inverter driven configuration cell.

FIG. 4 shows another example of an inverter driven configuration cell powered by supply S1. When the configuration of the cell is complete, the configuration clock signal CLK goes low and transistor 408 turns off. If the configuration cell stored a "0" (meaning a "1" at the input of inverter 404), then there will be a leakage current flow from high rail VDD (S1) through transistors 405, 403 and 402 to ground. In the same way, if the configuration cell stored a "1" (meaning a "0" at the input of inverter 404), then there will be leakage current flow from high rail VDD (S1) through transistors 401, 403 and 406 to ground.

Figure 5:
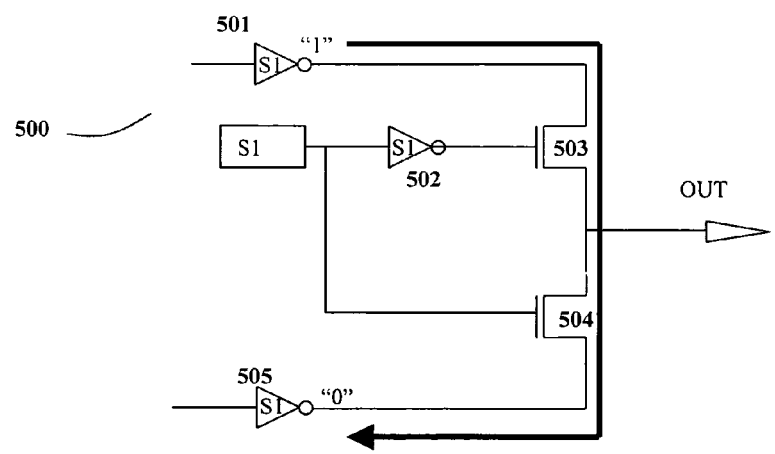
FIG. 5 shows leakage current in a multiplexer.

FIG. 5 shows another possibility of leakage current in a multiplexer (configurable/dynamic) 500. If multiplexer 500 has one input connected with an output of inverter 501 which is logic high and another input connected with an output of inverter 505 which is logic low, then there will be a leakage path from high rail VDD (S1) through inverters 504 and 505 to ground.

Figure 6:
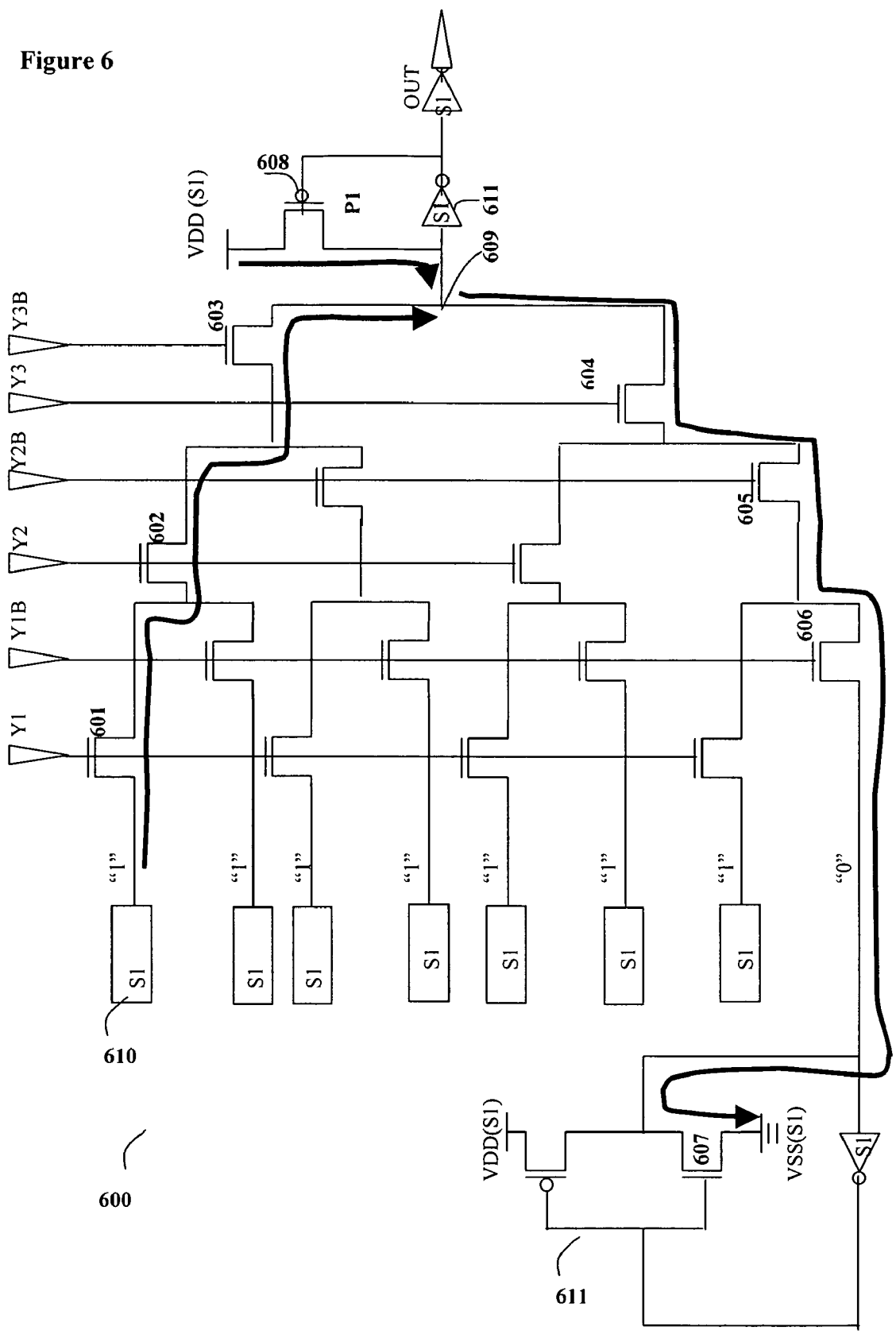
FIG. 6 shows another example of leakage current in LUTs.

FIG. 6 shows one possibility of the leakage current in LUTs. If signals Y1, Y2 and Y3B are stuck to high, then switches 601, 602 and 603 turn on to connect the corresponding configuration cell to an input of an inverter 611, which drives the output OUT. In this case, the transistors 606, 605 and 604 provide a path for the leakage current from node 609 through transistors 604, 605, 606 and 607 to ground if a "0" is stored in configuration cell 611.

Figure 7:
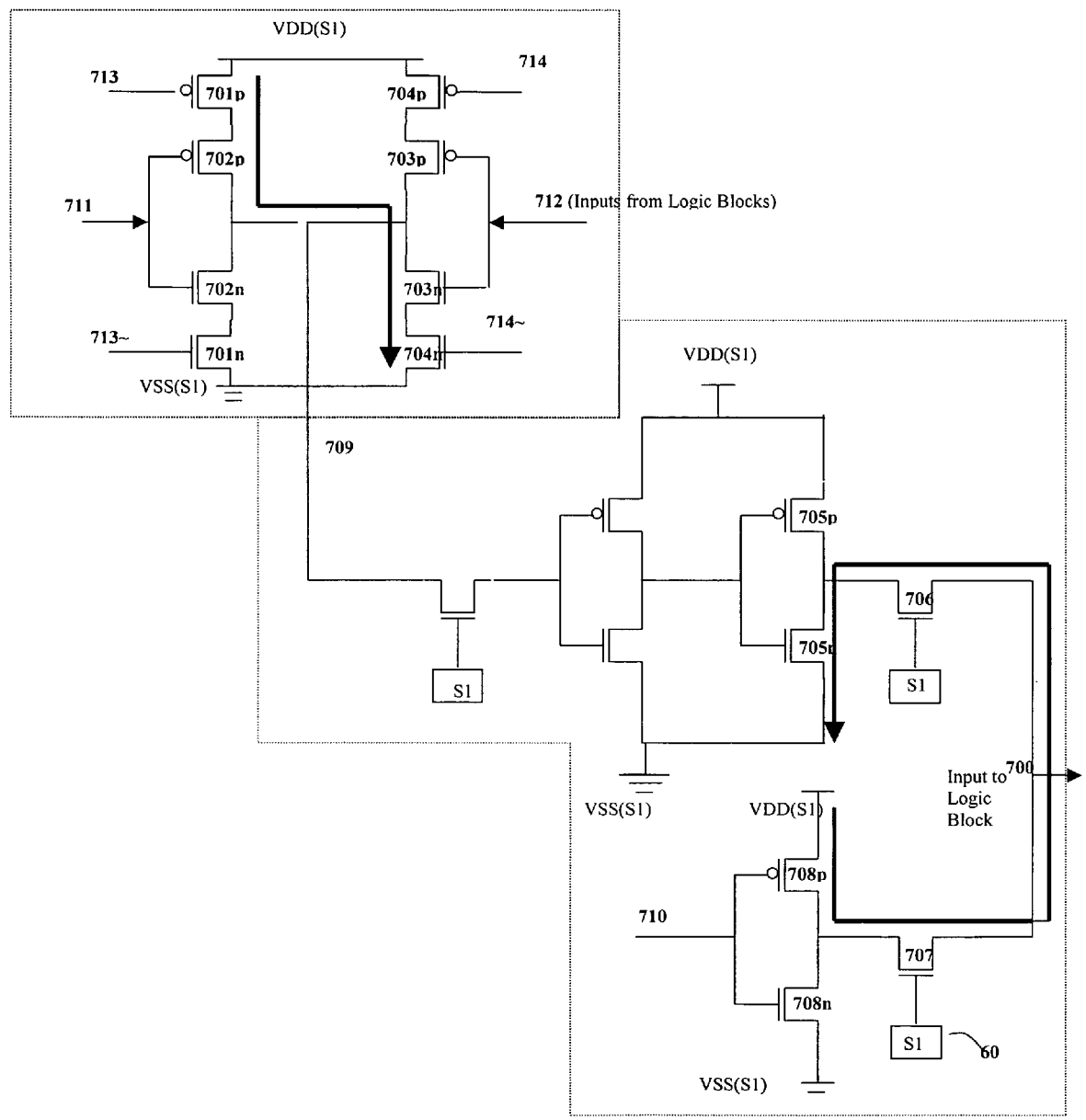
FIG. 7 an example of leakage current in routing part connecting one logic block output to another logic block inputs.

Referring to FIG. 7, an example of leakage current in a routing part used to connect one logic block output to another logic block input is shown. Logic block output 709 mostly driven by tristate inverters/buffers 702 and 703. Signals 711 and 712 are two different outputs from logic blocks for single output 709. Signals 713 and 714 are tristate control signals. To connect the signal 711 to output 709, signal 713 must be low and signal 714 must be high to tristate the inverter 703. To connect the signal 712 to output 709, signal 714 must be low and signal 713 must be high to tristate the inverter 702. So whenever low signal 711 is connected to output 709, then there will be a leakage current from high rail VDD (S1) through transistors 701$p$, 702$p$, 703$n$ and 704$n$ to ground. And for high signal 711, there will be a leakage current from high rail VDD (S1) through transistors 704$p$, 703$p$, 702$n$ and 701$n$ to ground. Similar cases can happen when inverter 702 is tristated and inverter 703 is active to connect the signal 712 to output 709. The same types of cases occur at the input of the logic block where flexibility is given to chose the output 709 or input 710 or no input signal for logic block input 700 using switches 706 and 707. There will be a leakage path either from high rail VDD (S1) through transistors 708$p$, 707, 706 and 705$n$ to ground or from high rail VDD (S1) through transistors 705$p$, 706, 707 and 708$n$ to ground depending on the inputs of inverters 705 and 708.

Figure 8:
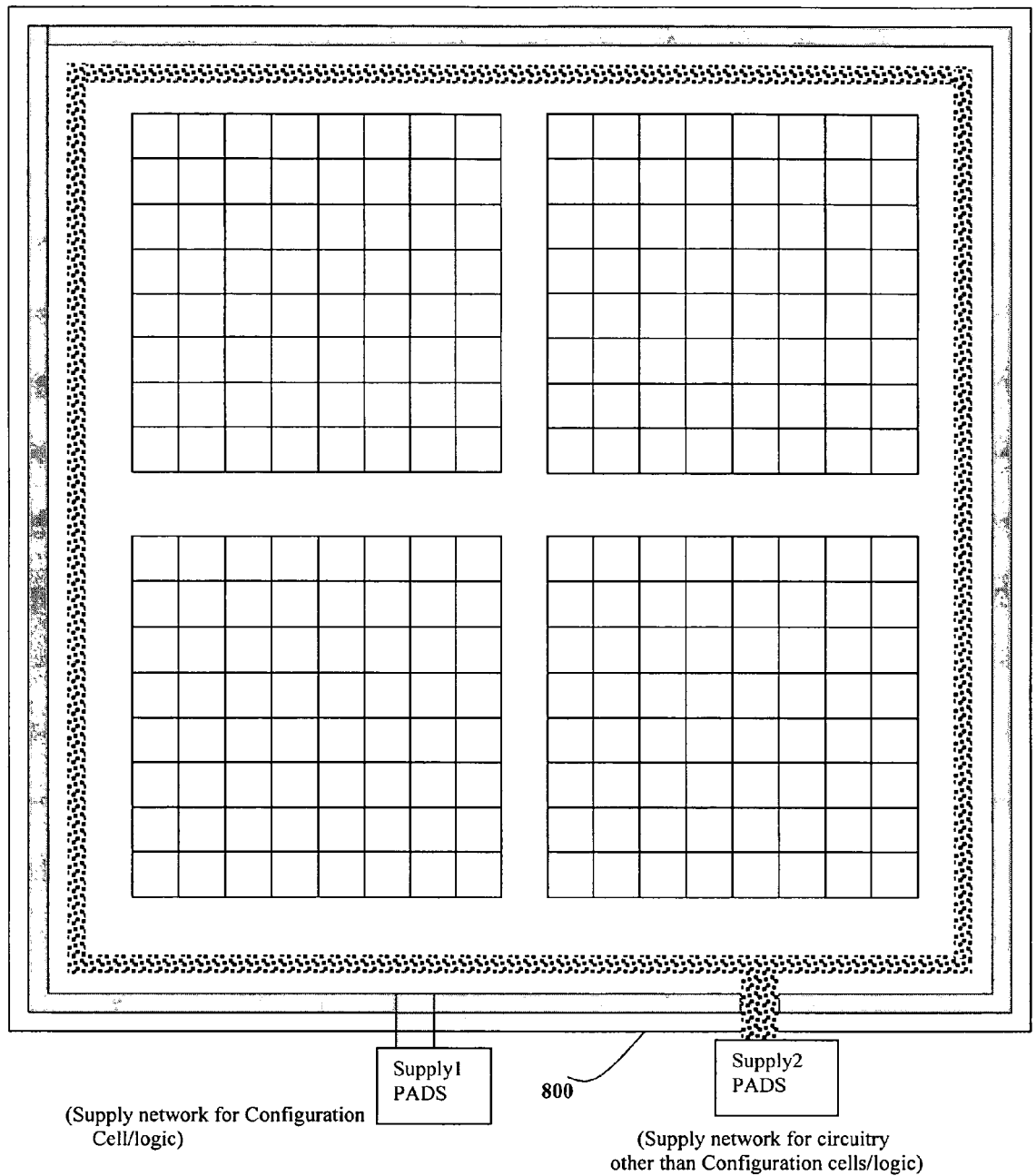
FIG. 8 shows a dual supply network in accordance with the invention.

FIG. 8 shows an embodiment according to the invention for programmable logic device 800. In this embodiment, a separate power supply S1 is used for the devices which lose content information on switching off the power and require a reconfiguration for resuming the operation. Whereas for the rest of the circuit, a separate power supply S2 is used so that power is switched off when these circuit are not in use, reducing power leakage and hence providing a low power consuming device.

A person skilled in the art will appreciate, it is possible to design an architecture based on the same concept for other electrical circuits also. The prior arts described here are only few simple example of leakage current in FPGA for easy understanding & clarifications. The invention described here is an illustrative example only and not the only possible embodiment. It is intended that the present invention encompass such changes and modifications as fall within the scope of the appended claims.

What is claimed is:

1. A programmable logic device with reduced power consumption, comprising:
   a set of data storage elements;
   at least a first power supply connected to the set of data storage elements;
   a set of substantially identical interconnected tiles, each including one or more logic blocks; and
   at least a second power supply independent of the first power supply connected to the identical tiles, wherein the second power supply is switched-off when the logic blocks are not being used.

2. A programmable logic device with reduced power consumption as claimed in claim 1, wherein the storage elements comprise one or more memory cells.

3. The programmable logic device with reduced power consumption as claimed in claim 1, wherein the storage elements comprise one or more configuration memory cells.

4. The programmable logic device with reduced power consumption as claimed in claim 1, wherein the storage elements comprise one or more registers.

5. The programmable logic device with reduced power consumption as claimed in claim 1, wherein the storage elements comprise one or more flip-flops.

6. The programmable logic device with reduced power consumption as claimed in claim 1, wherein the storage elements comprise any combination of memory cells, configuration memory cells, registers, and flip-flops.

7. The programmable logic device with reduced power consumption as claimed in claim 1, wherein each of the logic blocks includes one or more logic elements.

8. A method for reducing the power consumption in programmable logic device, comprising the steps of:
   providing a set of data storage elements;
   connecting at least a first power supply to the set of data storage elements;
   providing a set of substantially identical interconnected tiles, each including one or more logic blocks;
   coupling at least a second power supply independent of the first power supply to the identical tiles, and;
   switching off the second power supply when the tiles are not being used.

9. The method as claimed in claim 8, wherein the storage elements comprise one or more memory cells.

10. The method as claimed in claim 8, wherein the storage elements comprise one or more configuration memory cells.

11. The method as claimed in claim 8, wherein the storage elements comprise one or more registers.

12. The method as claimed in claim 8, wherein the storage elements comprise one or more flip-flops.

13. The method as claimed in claim 8, wherein each of the logic blocks comprises one or more logic elements.

14. A programmable logic device, comprising:
   a plurality of tiles, each of the tiles comprising at least one configuration cell and additional circuitry;
   a first pad capable of being coupled to a first power supply for supplying power to the at least one configuration cell in each of the tiles; and
   a second pad capable of being coupled to a second power supply for supplying power to the additional circuitry in each of the tiles, the second power supply independent of the first power supply.

15. The programmable logic device as claimed in claim 14, wherein the at least one configuration cell in each of the tiles comprises one or more data storage elements.

16. The programmable logic device as claimed in claim 15, wherein the data storage elements comprise one or more of: a memory cell, a configuration memory cell, a register, and a flip-flop.

17. The programmable logic device as claimed in claim 14, wherein the plurality of tiles comprises an array of substantially identical and interconnected tiles.

18. The programmable logic device as claimed in claim 14, further comprising the first power supply and the second power supply.

19. The programmable logic device as claimed in claim 18, wherein the second power supply is switched off when the additional circuitry is not in use.

20. The programmable logic device as claimed in claim 14, wherein the additional circuitry in each of the tiles comprises one or more logic blocks.

* * * * *

UNITED STATES PATENT AND TRADEMARK OFFICE
CERTIFICATE OF CORRECTION

| | | |
|---|---|---|
| PATENT NO. | : 7,078,932 B2 | Page 1 of 1 |
| APPLICATION NO. | : 10/830854 | |
| DATED | : July 18, 2006 | |
| INVENTOR(S) | : Parvesh Swami | |

It is certified that error appears in the above-identified patent and that said Letters Patent is hereby corrected as shown below:

Column 3, line 35, delete "image processing system" and replace with -- Field Programmable Gate Array (FPGA) --.

Signed and Sealed this

Twenty-seventh Day of March, 2007

JON W. DUDAS
*Director of the United States Patent and Trademark Office*